US010233538B2

(12) United States Patent
Hilkene et al.

(10) Patent No.: US 10,233,538 B2
(45) Date of Patent: *Mar. 19, 2019

(54) DEMAGNETIZATION OF MAGNETIC MEDIA BY C DOPING FOR HDD PATTERNED MEDIA APPLICATION

(71) Applicant: Applied Materials, Inc., Santa Clara, CA (US)

(72) Inventors: Martin A. Hilkene, Gilroy, CA (US); Roman Gouk, San Jose, CA (US); Matthew D. Scotney-Castle, Morgan Hill, CA (US); Peter I. Porshnev, Poway, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 291 days.

This patent is subject to a terminal disclaimer.

(21) Appl. No.: 15/193,307

(22) Filed: Jun. 27, 2016

(65) Prior Publication Data

US 2016/0305013 A1 Oct. 20, 2016

Related U.S. Application Data

(62) Division of application No. 13/715,786, filed on Dec. 14, 2012, now Pat. No. 9,376,746.

(Continued)

(51) Int. Cl.
*C23C 14/58* (2006.01)
*C23C 14/48* (2006.01)
(Continued)

(52) U.S. Cl.
CPC ........ *C23C 14/5826* (2013.01); *C23C 14/042* (2013.01); *C23C 14/0605* (2013.01);
(Continued)

(58) Field of Classification Search
CPC . C23C 14/48; C23C 14/0605; C23C 14/0635; C23C 14/5893
(Continued)

(56) References Cited

U.S. PATENT DOCUMENTS 5,266,409 A * 11/1993 Schmidt .............. C23C 14/0605
360/112
5,776,832 A * 7/1998 Hsieh ................ H01L 21/02071
438/669

(Continued)

FOREIGN PATENT DOCUMENTS

| CN | 1839465 A | 9/2006 |
| CN | 101946282 A | 1/2011 |
| JP | 2008135092 A | 6/2008 |

OTHER PUBLICATIONS

Chinese Office Action for Application No. 201280060754.5 dated Sep. 12, 2016 (11 total pages).

(Continued)

*Primary Examiner* — Dah-Wei D. Yuan
*Assistant Examiner* — Hai Y Zhang
(74) *Attorney, Agent, or Firm* — Patterson + Sheridan LLP

(57) ABSTRACT

Embodiments described herein provide methods and apparatus for treating a magnetic substrate having an imprinted, oxygen-reactive mask formed thereon by implanting ions into a magnetically active surface of the magnetic substrate through the imprinted oxygen-reactive mask, wherein the ions do not reduce the oxygen reactivity of the mask, and removing the mask by exposing the substrate to an oxygen-containing plasma. The mask may be amorphous carbon, through which carbon-containing ions are implanted into the magnetically active surface. The carbon-containing ions, which may also contain hydrogen, may be formed by activating a mixture of hydrocarbon gas and hydrogen. A (Continued)

ratio of the hydrogen and the hydrocarbon gas may be selected or adjusted to control the ion implantation.

20 Claims, 2 Drawing Sheets

Related U.S. Application Data

(60) Provisional application No. 61/576,655, filed on Dec. 16, 2011.

(51) Int. Cl.
| | |
|---|---|
| C23C 14/04 | (2006.01) |
| C23C 14/06 | (2006.01) |
| G11B 5/62 | (2006.01) |
| G11B 5/85 | (2006.01) |
| G11B 5/851 | (2006.01) |
| G11B 5/858 | (2006.01) |

(52) U.S. Cl.
CPC .......... *C23C 14/48* (2013.01); *C23C 14/5873* (2013.01); *G11B 5/62* (2013.01); *G11B 5/85* (2013.01); *G11B 5/851* (2013.01); *G11B 5/858* (2013.01)

(58) Field of Classification Search
USPC .................................................. 427/384–397
See application file for complete search history.

(56) References Cited

U.S. PATENT DOCUMENTS

| | | | | |
|---|---|---|---|---|
| 6,231,775 B1* | 5/2001 | Levenson | ............... | G03F 7/427 216/67 |
| 7,160,521 B2* | 1/2007 | Porshnev | ............... | B01D 53/68 422/186.04 |
| 2003/0104316 A1* | 6/2003 | Wang | ............... | B82Y 10/00 430/296 |
| 2004/0050686 A1* | 3/2004 | Huang | ............... | B82Y 10/00 204/173 |
| 2004/0259355 A1 | 12/2004 | Yin et al. | | |
| 2005/0042879 A1 | 2/2005 | Yin et al. | | |
| 2009/0065817 A1* | 3/2009 | Cartier | ............... | H01L 21/31116 257/288 |
| 2009/0130337 A1* | 5/2009 | Ovshinsky | ............... | C23C 16/24 427/575 |
| 2009/0162996 A1* | 6/2009 | Ramaswamy | ............... | H01L 21/2253 438/477 |
| 2009/0199768 A1* | 8/2009 | Verhaverbeke | ............... | G11B 5/855 118/728 |
| 2009/0201722 A1 | 8/2009 | Giridhar et al. | | |
| 2010/0047625 A1* | 2/2010 | Kamata | ............... | B82Y 10/00 428/800 |
| 2010/0165504 A1* | 7/2010 | Fukushima | ............... | G11B 5/855 360/75 |
| 2010/0190324 A1* | 7/2010 | Hilkene | ............... | H01L 21/2236 438/513 |
| 2010/0221583 A1* | 9/2010 | Foad | ............... | G11B 5/82 428/846 |
| 2010/0237042 A1 | 9/2010 | Nguyen et al. | | |
| 2010/0326819 A1 | 12/2010 | Lille et al. | | |
| 2011/0006034 A1 | 1/2011 | Hilkene et al. | | |
| 2012/0196155 A1* | 8/2012 | Bencher | ............... | G11B 5/855 428/836 |

OTHER PUBLICATIONS

International Search Report and Written Opinion for International Application PCT/US12/069510, dated Mar. 28, 2013.

H. S. Zhang & K. Komvopoulos, Surface modification of magnetic recording media by filtered cathodic vacuum arc, 106 J.App.Phys. 093504 (2009).

\* cited by examiner ns into a
DEMAGNETIZATION OF MAGNETIC MEDIA BY C DOPING FOR HDD PATTERNED MEDIA APPLICATION

CROSS-REFERENCE TO RELATED APPLICATIONS

This application is a divisional of copending U.S. patent application Ser. No. 13/715,786, filed Dec. 14, 2012, and issuing as U.S. Pat. No. 9,376,746, which claims benefit of U.S. Provisional Patent Application Ser. No. 61/576,655, filed Dec. 16, 2011, each of which is incorporated herein by reference.

FIELD

Embodiments described herein relate to methods of manufacturing magnetic media. More specifically, embodiments described herein relate to patterning of magnetic media by plasma exposure.

BACKGROUND

Magnetic media are used in various electronic devices such as hard disk drives and magnetoresistive random access memory (MRAM) devices. Hard-disk drives are the storage medium of choice for computers and related devices. They are found in most desktop and laptop computers, and may also be found in a number of consumer electronic devices, such as media recorders and players, and instruments for collecting and recording data. Hard-disk drives are also deployed in arrays for network storage. MRAM devices are used in various non-volatile memory devices, such as flash drives and dynamic random access memory (DRAM) devices.

Magnetic media devices store and retrieve information using magnetic fields. The disk in a hard-disk drive is configured with magnetic domains that are separately addressable by a magnetic head. The magnetic head moves into proximity with a magnetic domain and alters the magnetic properties of the domain to record information. To recover the recorded information, the magnetic head moves into proximity with the domain and detects the magnetic properties of the domain. The magnetic properties of the domain are generally interpreted as corresponding to one of two possible states, the "0" state and the "1" state. In this way, digital information may be recorded on the magnetic medium and recovered thereafter.

Magnetic storage media typically comprise a non-magnetic glass, composite glass/ceramic, or metal substrate with a magnetically susceptible material between about 100 nm and about 1 µm thick deposited thereon by a deposition process, commonly a PVD or CVD process. In one process, a layer comprising cobalt and platinum is sputter deposited on a structural substrate to form a magnetically active layer. The magnetically susceptible layer is generally either deposited to form a pattern, or is patterned after deposition, such that the surface of the device has areas of magnetic susceptibility interspersed with areas of magnetic inactivity denominated by orientation of their quantum spin. Where domains with different spin orientations meet, there is a region referred to as a Bloch wall in which the spin orientation goes through a transition from the first orientation to the second. The width of this transition region limits the areal density of information storage because the Bloch wall occupies an increasing portion of the total magnetic domain.

To overcome the limit due to Bloch wall width in continuous magnetic thin films, the domains can be physically separated by a non-magnetic region (which can be narrower than the width of a Bloch wall in a continuous magnetic thin film). Conventional approaches for creating discrete magnetic and non-magnetic areas on a medium have focused on forming single bit magnetic domains that are completely separate from each other, either by depositing the magnetic domains as separate islands or by removing material from a continuous magnetic film to physically separate the magnetic domains. A patterned mask may be applied to a non-magnetic substrate, and a magnetic material deposited over exposed portions of the non-magnetic substrate, or the magnetic material may be deposited before masking and patterning, and then etched away in exposed portions. By one method, the non-magnetic substrate is topographically patterned by etching or scribing, and the magnetically susceptible material deposited by spin-coating or electroplating. The disk is then polished or planarized to expose the non-magnetic boundaries around the magnetic domains. In some cases, the magnetic material is deposited in a patterned way to form magnetic grains or dots separated by a non-magnetic area.

Such methods are expected to yield storage structures capable of supporting data density up to about 1 TB/in$^2$, with individual domains having dimensions as small as 20 nm. All such methods typically result in significant surface roughness of the medium. Altering the topography of the substrate can become limiting because the read-write head of a typical hard-disk drive may fly as close as 2 nm from the surface of the disk. Thus, there is a need for a process or method of patterning magnetic media that has high resolution and does not alter the topography of the media, and an apparatus for performing the process or method efficiently for high volume manufacturing.

SUMMARY

Embodiments described herein provide methods of treating a magnetic substrate having an imprinted, oxygen-reactive mask formed thereon by implanting ions into a magnetically active surface of the magnetic substrate through the imprinted oxygen-reactive mask, wherein the ions do not reduce the oxygen reactivity of the mask. The mask is removed by exposing the substrate to an oxygen-containing plasma. The mask may be amorphous carbon, through which carbon-containing ions are implanted into the magnetically active surface. The carbon-containing ions, which may also contain hydrogen, may be formed by activating a mixture of hydrocarbon gas and hydrogen. A ratio of the hydrogen and the hydrocarbon gas may be selected or adjusted to control the ion implantation.

Embodiments described herein also provide methods of treating a substrate having a magnetically susceptible surface and an imprinted, oxygen-reactive barrier material formed on the magnetically susceptible surface, by disposing the substrate on a substrate support in a processing chamber, forming an activated gas mixture outside the processing chamber, flowing the activated gas mixture into the processing chamber, exposing the substrate to the activated gas mixture, implanting ions from the activated gas mixture into the magnetically susceptible surface through openings, holes, or trench-like structures in the barrier material by applying an electrical bias to the substrate, and exposing the substrate to an activated oxygen-containing gas to remove the barrier material, wherein the ions do not reduce the oxygen reactivity of the barrier material. The activated gas mixture may be a circulating plasma formed by applying RF power to a gas mixture containing carbon and hydrogen. A ratio of the hydrogen to the carbon may be adjusted or selected to control the ion implantation.

Further embodiments described herein provide methods of forming a patterned magnetic substrate by forming a patterned resist on a magnetically active surface of a substrate, wherein the patterned resist defines exposed portions and unexposed portions of the magnetically active surface, exposing the substrate to a carbon plasma, implanting carbon ions from the carbon plasma into the exposed portions of the magnetically active surface, and removing the patterned resist by exposing the substrate to an oxygen plasma.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
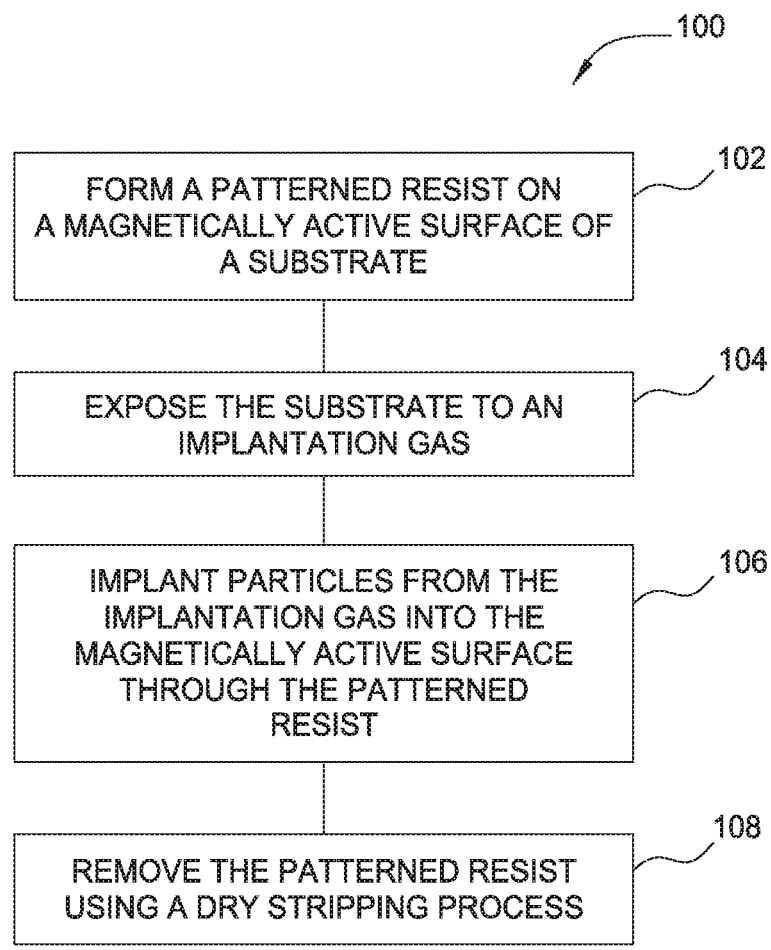
FIG. 1 is a flow diagram summarizing a method according to one embodiment.

Embodiments described herein generally provide methods and apparatus for forming a pattern of magnetic properties on a substrate. The substrates are generally metal, such as aluminum, or glass, and may be metal alloys or composite glass substances such as glass/ceramic blends. The substrates are generally coated with a magnetically susceptible material that provides a medium for magnetic patterning. The magnetically susceptible material may be formed in multiple layers, each layer having the same or different composition. In one embodiment, a first layer of low coercivity magnetic material, such as iron or iron/nickel alloy, is formed over the base substrate, and a second layer of higher coercivity magnetic material, such as a cobalt/nickel/platinum alloy, is formed over the first layer. These layers may be formed by any suitable method known to the art, such as physical vapor deposition, or sputtering, chemical vapor deposition, plasma-enhanced chemical vapor deposition, spin-coating, plating by electrochemical or electroless means, and the like.

A resist material is formed over the magnetically susceptible surface, and a patterning process is used to form a physical pattern in the resist material. The patterning process is usually an imprint or contact stamping or printing process, but may be a lithographic or other chemical process. The patterning process forms a mask from the resist material, creating openings such as holes or trench-like structures in the resist material that expose some areas of the magnetically susceptible surface for a subsequent processing step while other areas remain covered by resist material. The exposed areas may be entirely uncovered in some embodiments, while in other embodiments a thin layer of the resist material may be left covering the exposed areas.

A hardmask material may be used between the magnetically susceptible surface and the resist material, if desired. A hardmask may be more resistant to pattern drift during the implant process in some cases. The hardmask is patterned using the resist material as a mask, and then the hardmask is used to implant the magnetically susceptible surface.

Particles are implanted into the magnetically susceptible surface of the substrate, through the openings of the mask, to disrupt and/or change magnetic properties of the magnetically susceptible surface in the exposed areas, while the protected areas are unchanged. The mask forms a barrier material substantially preventing particles from reaching the protected areas of the substrate while allowing penetration of particles in the exposed areas of the substrate. Changes to the structure of the magnetically susceptible surface alters atomic spin axes, changing the local magnetic properties in the affected area. In this way, a pattern of magnetic properties is formed in the substrate surface that matches the pattern of the mask. The particles are typically formed as ions and accelerated toward the substrate by applying an electric field, for example by biasing the substrate. The particles may be partly or completely neutralized as they travel toward the substrate.

The topography of the magnetically susceptible surface is substantially unchanged by the patterning process because substantial quantities of material have not been added or removed from the magnetically susceptible surface. Preserving the topography of the magnetically susceptible surface is important in many applications because read/write structures typically fly very close to moving magnetic storage surfaces, in some cases at an elevation of 5 nm or less. In such applications, variations in topography may result in increased collisions between storage surfaces and read/write structures.

The mask is typically removed after the implant process. A chemical removal process is normally used. To avoid reducing susceptibility of the mask material, which may be a hardmask material, to chemical attack, the implanted particles are chosen to be chemically compatible with the mask, or susceptible to attack using a similar chemistry, so that a high concentration of the implanted particles in the mask material does not make the mask difficult to remove.

As implant particles are directed toward the substrate, some of the implant particles implant into, or deposit on, the mask. Such implantation and deposition may result in pattern drift as implanted ions distort the atomic structure of the resist material and as deposition alters the contours of the mask. To control such pattern drift during implantation, implant materials are chosen that are structurally compatible with, or not structurally foreign to, the resist material to minimize structural disruption of the resist material. Additionally, implant materials may be chosen that are easily removed when deposited on the mask.

FIG. 1 is a flow diagram summarizing a method according to one embodiment. At 102, a patterned resist is formed on a magnetically active surface of a substrate. The substrate may be any substrate having a magnetically active surface, such as any of the substrates described above. A magnetically active substrate is any substrate having a measurable magnetic property, such as magnetism, magnetic susceptibility, or magnetic coercivity, that makes the substrate magnetizable to any substantial degree or indicates the presence of a magnetic field or magnetic force emanating from the surface. A magnetically active surface may be a magnetically susceptible surface, or a surface having a magnetism or residual magnetism, or a surface with magnetic coercivity that is not so high as to resist substantially all magnetization. Materials used as storage media in magnetic storage devices are all magnetically active and magnetically susceptible materials that may be treated according to the methods described herein.

The resist may be patterned by contact means or by chemical means. The resist may be physically imprinted by direct contact with a solid template, or by using chemical means such as lithography. Imprint resists are typically made of materials that may be physically depressed, shaped, stamped, or otherwise imprinted with a pattern, by softening at temperatures slightly above room temperature if necessary. Amorphous carbon, amorphous sulfur, and solder are examples of such materials. Curable polymers that may be hardened after the pattern is imprinted may also be used. The patterned resist forms a mask that exposes some areas of the substrate surface and covers other areas.

The resist material is typically a material that is not magnetically active, and is subject to chemical attack so that the resist can be removed after patterning. Amorphous carbon and carbon-based polymers, for example, are examples of oxygen-reactive materials that may be stripped using an oxygen chemistry, for example by exposure to an oxygen-containing gas such as an oxygen plasma or an otherwise active oxygen-containing mixture.

As noted above, the resist material may be formed on a hardmask material. A carbon hardmask material will be removable by a chemistry that can remove the carbonaceous resist material. The carbon hardmask may be formed by a carbon deposition process, and may be patterned by using the resist as a mask. The patterning process typically uses a chemistry that may also attack the resist material, so the resist material may be coated with a material that is not reactive to the chemistry used to etch the hardmask. In the case of a carbon hardmask and carbon resist material, a silicon oxide layer may be blanket deposited over the patterned resist material and then etched to expose the tops of the resist pattern. The exposed resist may then be etched through the carbon hardmask using an oxygen chemistry or other suitable chemistry to expose the magnetically susceptible layer.

At 104, the substrate is exposed to an implantation gas. The implantation gas is selected to be chemically or structurally compatible with the resist material such that incorporation of material from the implantation gas in the resist material does not significantly distort the microstructure of the resist material or alter its susceptibility to subsequent removal. If a carbon-based resist material is used, the implantation gas may be a carbon-containing gas, so that carbon atoms or carbon-containing ions or particles from the gas that enter the resist material will not create dislocations that substantially swell the resist material or otherwise distort the mask pattern. The implantation gas may be a mixture of hydrogen and a hydrocarbon, for example, because carbon and hydrogen are not structurally foreign to the carbon resist material.

At 106, particles from the implantation gas are implanted into the magnetically active surface through the openings of the mask. Typically, the implantation gas is activated to produce ions that may be accelerated toward the substrate by application of an electric field, for example by applying an electrical bias to the substrate. The ions may be fully or partially neutralized as they travel toward the substrate, so the particles implanted may be ions, neutral particles such as radicals, or a mixture thereof. The particles travel through the mask, implanting into the magnetically active surface in the exposed areas, either directly or through a thin residual layer of resist material left from the patterning process. The implanted particles disrupt the atomic structure of the magnetically active surface, changing one or more magnetic properties of the magnetically active surface in the exposed areas according to the pattern of the resist. Measurable differences in the magnetic properties of domains in the surface having dimensions from 1 nm to 50 nm may be achieved in this way.

Particles from the implantation gas also interact with the resist material, depositing on or implanting in the resist material on surfaces of the resist material parallel to the magnetically active surface, perpendicular to the magnetically active surface, and at all other angles. To control any pattern drift due to interaction of the implantation gas with the resist material, material may be removed from the mask surface by including a scavenging gas with the implantation gas. In the example above, hydrogen may be used as a scavenging gas for carbon. Carbon-containing particles that deposit on the carbonaceous resist, on the thick areas of the mask, on the thin areas of the mask, or directly on the substrate surface in the mask openings may be scavenged by reaction with hydrogen in the implantation gas. The ratio of carbon to hydrogen, whether by volume, mass, or atomic equivalent, may be adjusted or selected to control the implantation by controlling any change to the pattern.

At 108, the resist material is removed using a dry stripping process. The resist material is exposed to a gas with which it reacts to form a volatile material that is removed from the chamber. According to the methods described herein, the implantation gas is selected so as not to reduce the chemical susceptibility of the resist material substantially. Continuing the example above, if amorphous carbon or carbon polymer is used as the resist material, and carbon ions and/or carbon-hydrogen ions are used for implantation, the resist material retains susceptibility to oxygen attack, and may be readily removed by exposure to oxygen, which may be activated, for example by ionization into a plasma, to speed the removal process. If a hardmask of compatible composition is used, the hardmask may also be removed in the same stripping process. For example, if a carbon hardmask is used with a carbon resist material, both may be removed during a single stripping process.

The processes described above are typically conducted at low temperatures to avoid thermal modification of the magnetic properties of the substrate. The substrate temperature is typically maintained below about 150° C. Because implantation processes typically raise the temperature of the substrate being processed, cooling is typically employed. The substrate may be processed on a cooled substrate support, as is known in the art, or the substrate may be cooled periodically by discontinuing implantation and allowing the substrate to cool. The implantation gas may assist in cooling the substrate by collecting heat from the substrate as it flows across the substrate surface, or a separate cooling gas may be employed. The rate of gas flow may be increased to speed the cooling process, if desired.

In one embodiment, a substrate is coated with polyvinyl acetate (PVA) into which a pattern is physically imprinted by contact with a template. The substrate is an aluminum platter that has a layer of CoPtNi alloy about 1 µm thick deposited thereon in a PVD process. The PVA is spin-coated onto the substrate, and the template contacted with the PVA layer before the PVA hardens. The PVA firms while in contact with the template, and fully hardens after the template is removed, yielding a patterned resist. The patterned resist has thick regions and thin regions, corresponding to protected areas of the substrate and exposed areas of the substrate. The thick regions are typically between about 50 nm and about 100 nm thick, while the thin regions are typically between about 1 nm and about 10 nm thick.

A carbon hardmask may be formed between the CoPtNi alloy layer and the PVA, if desired, by depositing an amorphous carbon layer using a PVD, CVD, or PECVD process. If a carbon hardmask is used, the carbon hardmask may be patterned after forming the patterned resist by depositing a silicon oxide layer over the patterned resist using a PVD, CVD, or PECVD process, etching the silicon oxide layer using a fluorine chemistry such as HF to expose the resist, and then ashing the resist and the carbon hardmask to expose the CoPtNi alloy layer.

The substrate is positioned on a substrate support in a plasma processing chamber. A P3i™ chamber available from Applied Materials, Inc., of Santa Clara, Calif., may be used for the plasma processing described herein. An activated gas mixture is provided to a processing zone proximate to the substrate surface. The activated gas mixture is a mixture of a hydrocarbon gas, such as methane or ethane, or a combination of hydrocarbons, and a hydrogen gas such as hydrogen or elemental hydrogen. An inert gas such as helium may also be included. The activated gas mixture is activated outside the processing chamber by exposing a gas mixture with one or more hydrocarbons, optionally hydrogen, and optionally an inert gas to an electromagnetic field, such as an electric field, a magnetic field, or a combined electric and magnetic field (i.e. electromagnetic radiation). The electromagnetic energy may be applied in the form of RF power, DC power, or microwave radiation, among other forms. Ions are generated, and the activated gas mixture flows into the processing chamber to interact with the substrate.

Methane gas is provided at a flow rate of 40 sccm in one embodiment where fourteen two-inch disks are processed simultaneously in a single chamber. The methane gas is activated in a 400 W inductive RF source and flowed into the processing chamber. Hydrogen gas is included in a volume ratio of methane to hydrogen between about 0.1 and about 5.0, such as between about 1.0 and about 4.0, for example about 2.5. Helium gas is included in a volume ratio of methane to helium between about 0.1 and about 5.0, such as between about 1.0 and about 4.0, for example about 2.5. $CF_4$ may also be included in the gas mixture in a volume ratio of methane to $CF_4$ between about 1.0 and about 10.0, such as between about 3.0 and about 8.0, for example about 5.5. $B_2H_6$ may also be included in the gas mixture in a ratio of methane to $B_2H_6$ between about 2.0 and about 3.0.

The ratio of methane and hydrogen in the activated gas may be adjusted or selected to control the implantation process by controlling pattern drift in the mask. As carbon from the activated gas mixture deposits on or implants into the mask, hydrogen from the activated gas mixture reacts with loosely bound carbon on the mask surface to form volatile species. Increasing the amount of hydrogen accelerates the process of material removal from the mask, if desired, controlling drift in dimensions of the pattern.

An electric field is established proximate the substrate to accelerate the ions toward the substrate surface. Hydrocarbon ions travel toward the substrate surface and penetrate through the openings of the mask to impact the magnetically active material in the exposed regions. The hydrocarbon ions implant in, or deposit on, the mask above the protected regions of the substrate surface. Continuing the example above, the electric field is an RF bias between about 7 kV and about 10 kV, such as between about 7.5 kV and about 9.5 kV, for example about 8.5 kV, applied to the substrate support. Pressure in the processing chamber is maintained in a range of about 6-15 mTorr.

Implant progresses for 60-120 seconds, yielding a dose between about $1\times10^{17}$ ions/cm$^2$ and about $1\times10^{18}$ ions/cm$^2$. A temperature of the substrate is monitored. If the temperature approaches 130° F. during processing, exposure to the activated gas mixture, and biasing of the substrates, may be discontinued to allow the substrates to cool. High temperature is typically avoided during processing to avoid thermally disrupting the magnetic properties of the substrate. Gas flow may be continued through the processing chamber without activating the gas mixture to carry heat away from the substrates. In one embodiment, only the inert gas flow, for example helium, is continued during the cooling process. To speed the cooling process, gas flow through the chamber may be increased. For example helium may be flowed through the chamber at a flow rate of 50 sLm for about 10 seconds to cool the substrates. Following the cooling period, the substrates may be exposed to the activated gas mixture again to continue implantation, if desired. The implantation and cooling steps may be repeated any number of times in a cycle until the desired implantation is complete.

The carbon mask may be removed by exposing the substrate to an oxygen-containing gas. The oxygen-containing gas may be activated and may form a plasma, which may be an oxygen plasma. A gas mixture containing oxygen and optionally hydrogen and $CF_4$ may be activated by exposure to a magnetic field from the inductive RF source described above. The substrate is typically exposed to the oxygen-containing gas between about 30 seconds and about 5 minutes, depending on the reactivity of the oxygen-containing gas with the carbon mask.

During the implantation process 106 described above, material may collect on internal chamber surfaces. Such material may be removed during the resist removal process 108 described above. Each substrate or batch of substrates may be overstripped to ensure the chamber surfaces are fully clean prior to processing the next substrate or batch, or the chamber may be cleaned after a number of implant processes are performed. In a carbon implant embodiment, chamber cleaning may be improved by seasoning the chamber surfaces with silicon oxide prior to implantation processing by any convenient process. If desired, an optical sensor may be deployed to determine an end point in the chamber clean process. The optical sensor may detect a difference in a reflection or emission spectrum when carbon, or any other implant materials, covering the silicon oxide is removed.

Other materials may be used to mask and implant for magnetic patterning. For example, a physically patterned silicon oxide layer may be formed by silane-peroxide deposition of liquid $Si(OH)_4$ near room temperature, contacting with a template, and warming to between 100° F. and 150° F. to polymerize. The template is removed before the silicon oxide layer fully hardens. Silicon may then be used to implant through the patterned silicon oxide layer in a process similar to that described above, with hydrogen and/or fluorine controlling silicon deposition. An HF containing gas, which may be activated, may then be used to remove the silicon oxide mask. Generally, use of a mask material that is structurally and chemically compatible with the implant material affords minimal pattern drift during implantation and control of any pattern drift that does occur, and predictable susceptibility to chemical attack so the mask may be readily removed after implantation.

Figure 2:
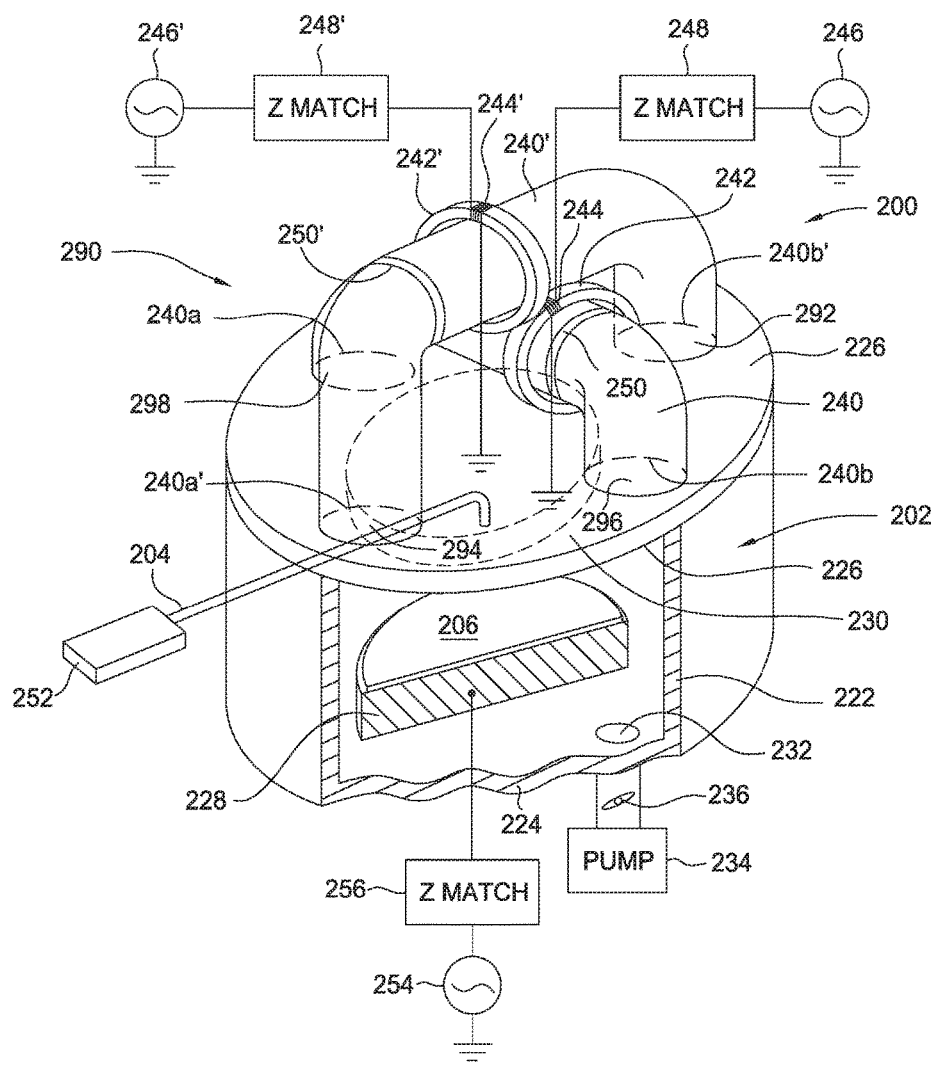
FIG. 2 is a perspective view of a processing chamber operable to practice the methods described herein.

FIG. 2 is an isometric view of a processing chamber 200 that may be used to practice any of the methods described herein. The chamber of FIG. 2 is useful for performing ion implantation procedures, but may also be used to shower a substrate with energetic ions without implanting. The processing chamber 200 includes a chamber body 202 having a bottom 224, a top 226, and side walls 222 enclosing a process region 204. A substrate support assembly 228 is supported from the bottom 224 of the chamber body 202 and is adapted to receive a substrate 206 for processing. A gas distribution plate 230 is coupled to the top 226 of the chamber body 202 facing the substrate support assembly 228. A pumping port 232 is defined in the chamber body 202 and coupled to a vacuum pump 234. The vacuum pump 234 is coupled through a throttle valve 236 to the pumping port 232. A process gas source 252 is coupled to the gas distribution plate 230 to supply gaseous precursor compounds for processes performed on the substrate 206.

The chamber 200 depicted in FIG. 2 further includes a plasma source 290. The plasma source 290 includes a pair of separate external reentrant conduits 240, 240' mounted on the outside of the top 226 of the chamber body 202 disposed transverse to one another or orthogonal to one another. The first external conduit 240 has a first end 240a coupled through an opening 298 formed in the top 226 into a first side of the process region 204 in the chamber body 202. A second end 240b has an opening 296 coupled into a second side of the process region 204. The second external reentrant conduit 240b has a first end 240a' having an opening 294 coupled into a third side of the process region 204 and a second end 240b' having an opening 292 into a fourth side of the process region 204. In one embodiment, the first and second external reentrant conduits 240, 240' are configured to be orthogonal to one another, thereby providing the two ends 240a, 240a', 240b, 240b' of each external reentrant conduits 240, 240' disposed at about 90 degree intervals around the periphery of the top 226 of the chamber body 202. The orthogonal configuration of the external reentrant conduits 240, 240' allows a plasma source distributed uniformly across the process region 204. It is contemplated that the first and second external reentrant conduits 240, 240' may have other configurations utilized to control plasma distribution in the process region 204.

Magnetically permeable torroidal cores 242, 242' surround a portion of a corresponding one of the external reentrant conduits 240, 240'. The conductive coils 244, 244' are coupled to respective RF power sources 246, 246' through respective impedance match circuits or elements 248, 248'. Each external reentrant conduits 240, 240' is a hollow conductive tube interrupted by an insulating annular ring 250, 250' respectively that interrupts an otherwise continuous electrical path between the two ends 240a, 240b (and 240a', 204b') of the respective external reentrant conduits 240, 240'. Ion energy at the substrate surface is controlled by an RF bias generator 254 coupled to the substrate support assembly 228 through an impedance match circuit or element 256.

Process gases including gaseous compounds supplied from the process gas source 252 are introduced through the overhead gas distribution plate 230 into the process region 204. RF power source 246 is coupled from the power applicators, i.e., core and coil, 242, 244 to gases supplied in the conduit 240, which creates a circulating plasma current in a first closed torroidal path power source 246' may be coupled from the other power applicators, i.e., core and coil, 242', 244' to gases in the second conduit 240', which creates a circulating plasma current in a second closed torroidal path transverse (e.g., orthogonal) to the first torroidal path. The second torroidal path includes the second external reentrant conduit 240' and the process region 204. The plasma currents in each of the paths oscillate (e.g., reverse direction) at the frequencies of the respective RF power sources 246, 246', which may be the same or slightly offset from one another.

Using the apparatus of FIG. 2, the methods described herein may be processed by forming an activated gas mixture outside the processing chamber and flowing the activated gas mixture into the processing chamber to apply to a substrate or substrates disposed therein. The activated gas may be formed into a circulating plasma that flows through the chamber in proximity to the substrate such that the electrical bias applied to the substrate may capture ions from the circulating plasma. The circulating plasma may have a torroidal shape, and more than one circulating plasma may be formed. For example, if two inductive sources are used, two circulating plasmas may form.

While the foregoing is directed to embodiments of the invention, other and further embodiments of the invention may be devised without departing from the basic scope thereof.

What is claimed is:

1. A method of treating a substrate, comprising:
positioning the substrate into a process volume, the substrate having a patterned oxygen-reactive mask comprising carbon disposed on a magnetically active surface of the substrate, the patterned oxygen-reactive mask defining exposed portions of the magnetically active surface;
exposing the substrate to a gas mixture comprising methane, hydrogen, tetrafluoromethane ($CF_4$), and diborane ($B_2H_6$), wherein the gas mixture has a volume ratio of the methane to the hydrogen between about 0.1 and about 5.0, a volume ratio of the methane to the $CF_4$ between about 1.0 and about 10.0, and a volume ratio of the methane to the $B_2H_6$ between about 2.0 and about 3.0;
applying a radio frequency (RF) bias to the gas mixture;
discontinuing the exposing of the substrate and the applying of the RF bias to the gas mixture; and
removing the patterned oxygen-reactive mask by exposing the substrate to an oxygen-containing plasma.

2. The method of claim 1, wherein the patterned oxygen-reactive mask comprises amorphous carbon.

3. The method of claim 1, wherein the gas mixture is activated outside the process volume by applying a RF power to the gas mixture with an inductive RF source.

4. The method of claim 1, wherein the RF bias is between about 7 kV and about 10 kV.

5. The method of claim 1, wherein the RF bias is applied to the gas mixture for an interval between about 60 seconds and about 120 seconds.

6. The method of claim 5, wherein the applying of the RF bias to the gas mixture for the interval yields a dose between about $1 \times 10^{17}$ ions/cm$^2$ and about $1 \times 10^{18}$ ions/cm$^2$.

7. The method of claim 1, further comprising:
monitoring a temperature of the substrate while exposing the substrate to the gas mixture and the applying of the RF bias to the gas mixture;
discontinuing the exposing of the substrate to the gas mixture and the applying of the RF bias to the gas mixture when the temperature of the substrate is greater than about 130° F.; and
flowing helium into the process volume.

8. The method of claim 7, further comprising repeating the exposing of the substrate to the gas mixture and the applying of the RF bias to the gas mixture, the monitoring of the temperature of the substrate, the discontinuing of the exposing of the substrate to the gas mixture and the applying of the RF bias to the gas mixture when the temperature of the substrate is greater than about 130° F.; and the flowing of helium into the process volume.

9. The method of claim 7, wherein the helium is flowed into the process volume at a flow rate of about 50 sLm for a volume for a period of time of about 10 seconds.

10. A method of treating a substrate, comprising:
disposing a substrate on the substrate support in a processing chamber, the substrate having a patterned oxygen-reactive mask comprising carbon disposed on a magnetically active surface of the substrate, the patterned oxygen-reactive mask defining exposed portions of the magnetically active surface;
forming an activated gas mixture outside the processing chamber, the activated gas mixture comprising methane, hydrogen, tetrafluoromethane ($CF_4$), and diborane ($B_2H_6$) activated by applying a radio frequency (RF) power, wherein the activated gas mixture has a volume ratio of the methane to the hydrogen between about 0.1 and about 5.0, a volume ratio of the methane to the $CF_4$ between about 1.0 and about 10.0, and a volume ratio of the methane to the $B_2H_6$ between about 2.0 and about 3.0;
flowing the activated gas mixture into the processing chamber;
exposing the substrate to the activated gas mixture;
applying a RF bias to the activated gas mixture;
discontinuing the exposing of the substrate and the applying of the RF bias to the activated gas mixture; and
removing the patterned oxygen-reactive mask by exposing the substrate to an oxygen-containing plasma.

11. The method of claim 10, wherein the patterned oxygen-reactive mask comprises amorphous carbon.

12. The method of claim 10, wherein the RF power is a 400 W inductive RF source.

13. The method of claim 10, wherein the RF bias is between about 7 kV and about 10 kV.

14. The method of claim 10, wherein the RF bias is applied to the activated gas mixture for an interval between about 60 seconds and about 120 seconds.

15. The method of claim 10, further comprising:
monitoring a temperature of the substrate while exposing the substrate to the activated gas mixture and the applying of the RF bias to the activated gas mixture;
discontinuing the exposing of the substrate to the activated gas mixture and the applying of the RF bias to the activated gas mixture when the temperature of the substrate is greater than about 130° F.; and
flowing helium into the processing chamber.

16. The method of claim 15, further comprising repeating the exposing of the substrate to the activated gas mixture and the applying of the RF bias to the activated gas mixture, the monitoring of the temperature of the substrate, the discontinuing of the exposing of the substrate to the activated gas mixture and the applying of the RF bias to the activated gas mixture when the temperature of the substrate is greater than about 130° F.; and the flowing of helium into the processing chamber.

17. A method of treating a substrate, comprising:
positioning the substrate into a process volume, the substrate having a patterned oxygen-reactive mask comprising carbon disposed on a magnetically active surface of the substrate, the patterned oxygen-reactive mask defining exposed portions of the magnetically active surface;
exposing the substrate to a gas mixture comprising methane, hydrogen, tetrafluoromethane ($CF_4$), and diborane ($B_2H_6$), wherein the gas mixture has a volume ratio of the methane to the hydrogen between about 0.1 and about 5.0, a volume ratio of the methane to the $CF_4$ between about 1.0 and about 10.0, and a volume ratio of the methane to the $B_2H_6$ between about 2.0 and about 3.0;
applying a radio frequency (RF) bias to the gas mixture;
monitoring a temperature of the substrate while exposing the substrate to the gas mixture and the applying of the RF bias to the gas mixture;
discontinuing the exposing of the substrate to the gas mixture and the applying of the RF bias to the gas mixture when the temperature of the substrate is greater than about 130° F.;
flowing helium into the process volume; and
removing the patterned oxygen-reactive mask by exposing the substrate to an oxygen-containing plasma.

18. The method of claim 17, wherein the patterned oxygen-reactive mask comprises amorphous carbon.

19. The method of claim 17, wherein the RF bias is between about 7 kV and about 10 kV.

20. The method of claim 17, further comprising repeating the exposing of the substrate to the gas mixture and the applying of the RF bias to the gas mixture, the monitoring of the temperature of the substrate, the discontinuing of the exposing of the substrate to the gas mixture and the applying of the RF bias to the gas mixture when the temperature of the substrate is greater than about 130° F.; and the flowing of helium into the process volume.

* * * * *